United States Patent
Motwani et al.

(10) Patent No.: US 9,698,830 B2
(45) Date of Patent: Jul. 4, 2017

(54) SINGLE-BIT FIRST ERROR CORRECTION

(71) Applicant: INTEL CORPORATION, Santa Clara, CA (US)

(72) Inventors: Ravi H. Motwani, San Diego, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 624 days.

(21) Appl. No.: 13/780,690

(22) Filed: Feb. 28, 2013

(65) Prior Publication Data

US 2014/0245096 A1    Aug. 28, 2014

(51) Int. Cl.
*H03M 13/00*    (2006.01)
*H03M 13/37*    (2006.01)
*H03M 13/13*    (2006.01)
*H03M 13/15*    (2006.01)

(52) U.S. Cl.
CPC ....... *H03M 13/3715* (2013.01); *H03M 13/13* (2013.01); *H03M 13/152* (2013.01); *H03M 13/1515* (2013.01)

(58) Field of Classification Search
USPC .................................................. 714/758, 763
See application file for complete search history.

(56) References Cited

U.S. PATENT DOCUMENTS

| | | | |
|---|---|---|---|
| 6,675,349 B1* | 1/2004 | Chen | 714/804 |
| 2002/0157044 A1* | 10/2002 | Byrd | 714/703 |
| 2006/0031741 A1* | 2/2006 | Ou et al. | 714/777 |
| 2009/0106633 A1* | 4/2009 | Fujiwara et al. | 714/785 |
| 2010/0257433 A1* | 10/2010 | Weingarten et al. | 714/782 |
| 2013/0254628 A1* | 9/2013 | Kim et al. | 714/773 |

* cited by examiner

*Primary Examiner* — M. Mujtaba Chaudry
(74) *Attorney, Agent, or Firm* — Schwabe, Williamson & Wyatt, P.C.

(57) ABSTRACT

Embodiments include device, storage media, and methods for decoding a codeword of encoded data. In embodiments, a processor may be coupled with a decoder and configured to multiply the codeword and a parity-check matrix of the encoded data to produce a syndrome. If the syndrome is non-zero then the processor may identify a bit error in the codeword based at least in part on a comparison of the syndrome to one or more columns of the parity-check matrix. Other embodiments may be described and claimed.

13 Claims, 5 Drawing Sheets

SINGLE-BIT FIRST ERROR CORRECTION

FIELD

Embodiments of the present invention relate generally to the technical field of data storage devices. Specific embodiments include methods of correcting single-bit errors in cells of non-volatile memory (NVM).

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

NVM may store encoded data, and accessing the data may require receiving and decoding a codeword of the encoded data. For example, the data may be encoded according to a Reed-Solomon (RS) or Bose-Chaudry-Hocquehen (BCH) encoding algorithm. The decoder may then decode the codeword according to a Berlekamp-Massey (BM) algorithm. In some instances, the codeword may be corrupt and have one or more bit errors which the BM algorithm may be used to fix. In certain embodiments, the BM algorithm may be unnecessarily power intensive.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
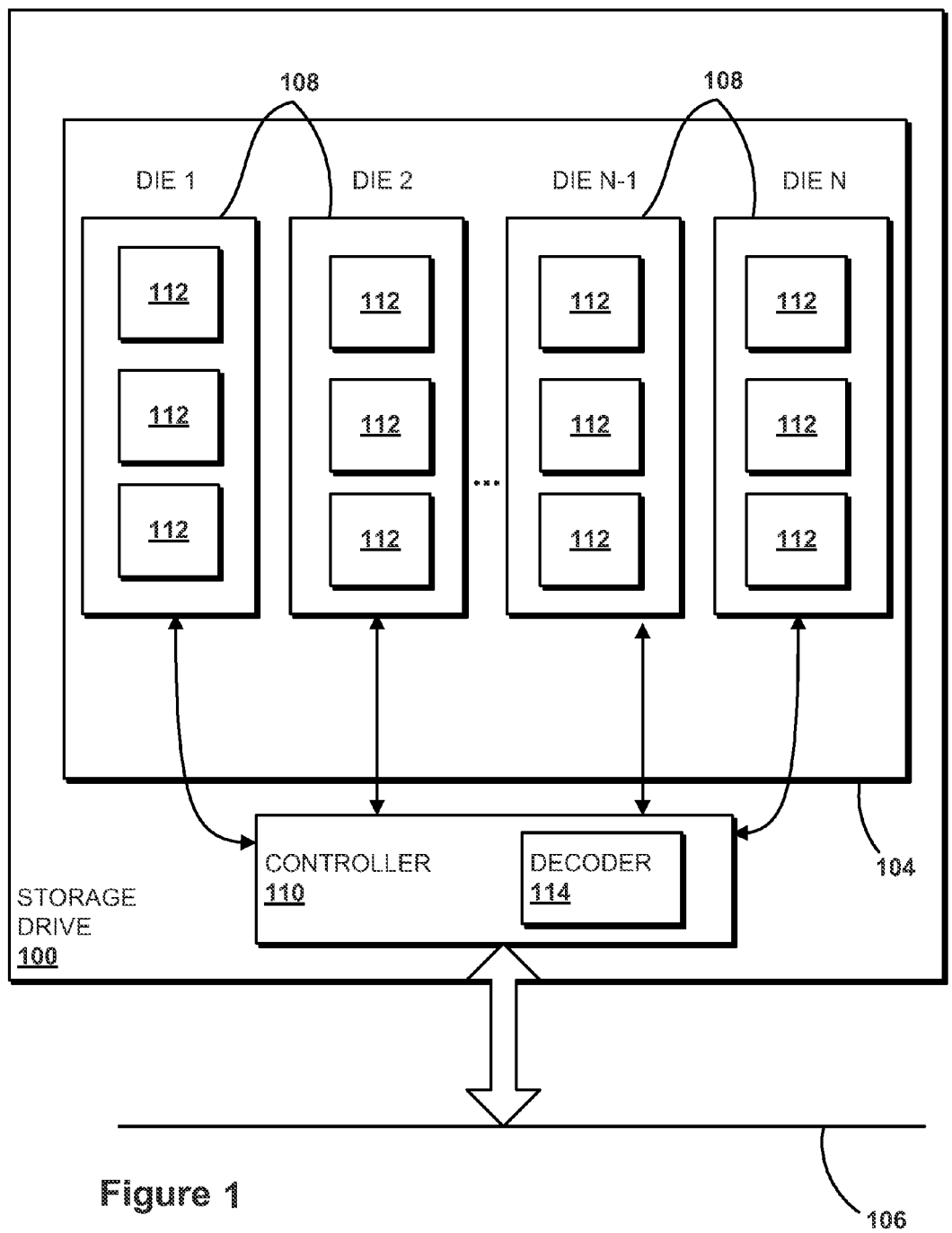
FIG. 1 illustrates an example storage drive storing one or more codewords of encoded data in die of NVM, in accordance with various embodiments.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Devices, methods, and storage media associated with NVM are described herein. In embodiments, a controller may be configured to decode a codeword of an encoded data, and the codeword may have a single-bit error. The controller may be further configured to identify a parity-check matrix. The controller may multiply the received codeword and the parity-check matrix to produce a syndrome of the data, if the syndrome is non-zero, the controller may compare the non-zero syndrome to the parity-check matrix and identify a column of the parity-check matrix that matches the non-zero syndrome. The controller may then determine the location of the column in the parity-check matrix and, based at least in part on the location of the column, identify and correct the single-bit error of the decoded codeword. In some embodiments, the controller may be able to convert the parity-check matrix from a non-binary matrix to a binary-matrix. In some embodiments, the comparison of the syndrome to the parity-check matrix may be performed according to a binary search tree algorithm. In some embodiments, the controller may be configured to perform a multi-bit error correction if the single-bit error correction fails.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smartphone (which may include one or more processors), a tablet, laptop computer, a set-top box, a gaming console, and so forth.

With reference to FIG. 1, in various embodiments, a storage device 100, may include NVM 104. Information may be written to and/or read from NVM 104 by a controller 110, e.g., by way of one or more communication lines 106 such as one or more buses such as a serial advanced technology attachment (SATA) bus, a peripheral component interconnect (PCI) bus, a PCI Express (PCIe) bus, a serial attached small computer system interface (SAS) bus, a fibre channel (FC) bus, or some other type of bus. The read or write processes may be respectively performed by a "reader" or "writer" which may be separate from one another, or combined. In some embodiments the reader or writer may be part of the controller 110, or they may be physically separate from, but communicatively coupled with, controller 110. In some embodiments, the reader and the writer may be implemented as hardware, firmware, software, or some combination thereof.

In embodiments, controller 110 may comprise, be a part of, or otherwise be coupled with a system on chip (SoC) having a processor with one or more cores, memory, input/output (I/O) interfaces or other elements as will be described in further detail with respect to FIG. 5. In some embodiments, the controller 110 may be implemented, for example in a mobile device such as a smart phone, as a SoC coupled with NVM 104.

Although not depicted, various other components may be coupled with storage device 100 via one or more communication lines 106, including but not limited to one or more central processing units (CPUs), volatile memory (e.g., dynamic random access memory, or DRAM), one or more input/output (I/O) devices, alternative processing units (e.g., graphics processors), and so forth. In various embodiments, storage device 100 may be a solid state drive (SSD) or hybrid hard disk drive (HHDD).

NVM 104 may come in various forms, including but not limited to NAND (flash) memory, ferroelectric random-access memory (FeTRAM), nanowire-based non-volatile memory, three-dimensional (3D) crosspoint memory such as phase change memory (PCM), memory that incorporates memristor technology, magnetoresistive random-access memory (MRAM), pin transfer torque (STT)-MRAM, and so forth. In many cases, including the example of FIG. 1, NVM 104 may include a plurality of die 108. For example, in FIG. 1, NVM 104 includes N die 108. N may be any positive integer. In other embodiments, NVM 104 may only include a single die 108. As shown in FIG. 1, each die 108 may have one or more cells 112 of memory. Although three cells 112 are shown per die 108 in the embodiment of FIG. 1, die of other embodiments may have more or less cells 112. Additionally, each die 108 does not necessarily have to have the same amount of cells 112 as another die 108. Finally, the data may be arranged in different groupings as described herein, for example the cells 112 may be arranged as blocks or pages of memory.

In various embodiments, error correcting codes may be used with original data stored in NVM 104 to protect the original data from raw bit errors. For example, the data may be encoded, e.g., by controller 110, into a "codeword." Various encoding schemes may be employed. For example, in various embodiments, concatenated coding, turbo coding, low-density parity-check (LDPC) coding, RS coding, BCH coding, etc. may be employed. In various embodiments, controller 110 may be any combination of hardware and software, and may be separate from storage device 100, e.g., as an independent component, e.g., on a printed circuit board ("PCB," not shown).

In various embodiments, a codeword may include the original data plus parity data appended to the end. However, the form of the codeword is not material, and in other embodiments, codewords may take other forms. In general, the larger the codeword, the higher resilience NVM 104 may have to bit errors.

In various embodiments, controller 110 may be configured to decode and/or perform error correction on a codeword after the codeword is read from NVM 104. Various types of decoding and error correction schemes such as the BM algorithm may be employed by controller 110.

In some embodiments, for example embodiments where the NVM 104 is 3D crosspoint memory, the codewords of the encoded data may have very low raw bit error rates (RBERs), for example an average on the order of $1\times10^{-5}$ errors per codeword. In some embodiments, 90% of the codewords may be either error free, or only have a single bit in error. In these embodiments, the BM algorithm may be unnecessarily power intensive, because it may result in the expenditure of a significant amount of processing power by the controller 110 to resolve a single-bit error in a codeword. Accordingly, in embodiments, the controller 110 may be configured with the logic to practice the techniques of the present disclosure to correct a single-bit error, which may be less power intensive.

Figure 2:
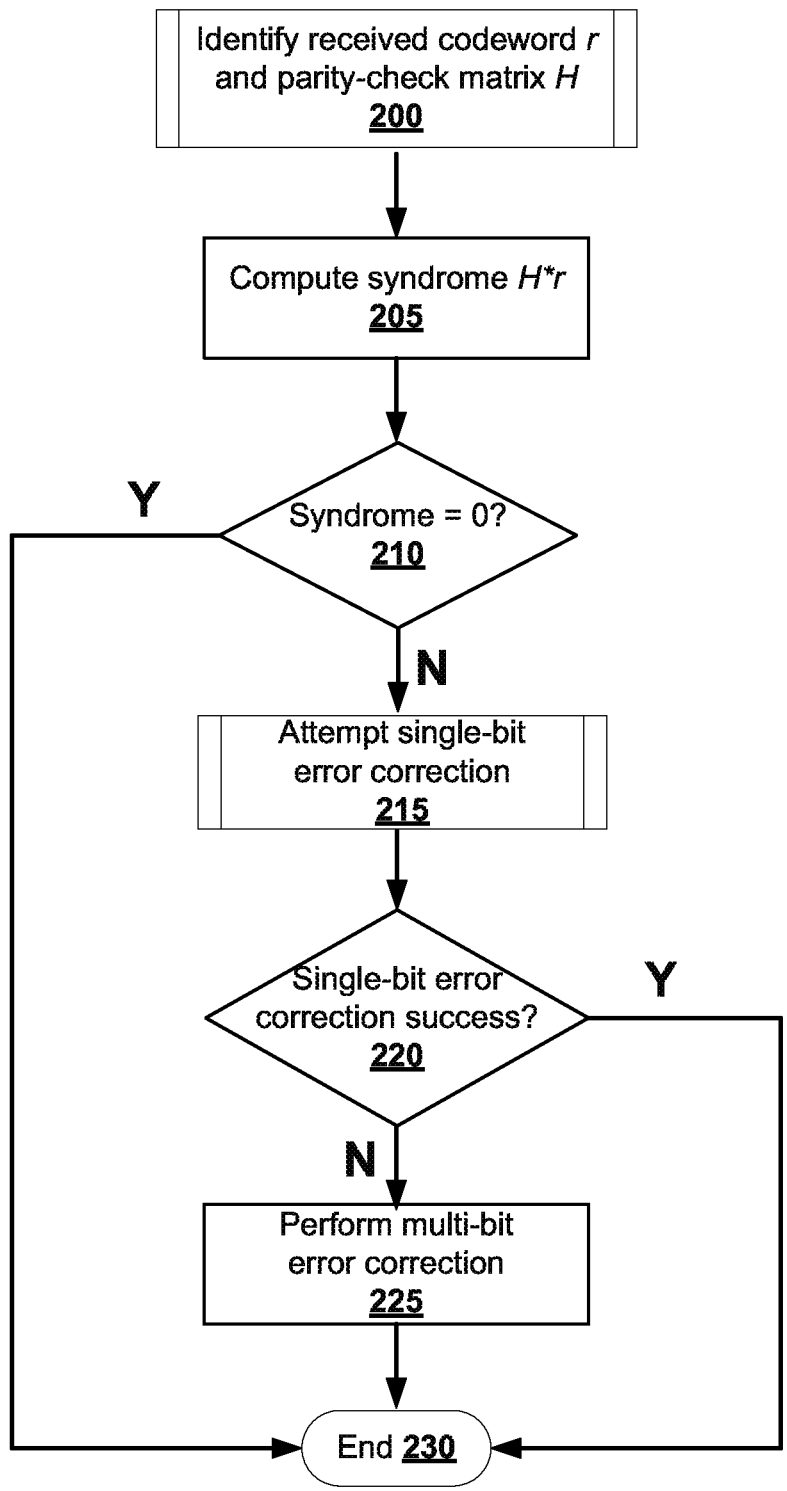
FIG. 2 illustrates an example high-level process of correcting errors in a codeword, in accordance with various embodiments.

FIG. 2 illustrates an example process which may result in reduced power expenditure for correcting single-bit errors in codewords. In embodiments, the process may be performed by a controller such as controller 110, as described earlier, or some other element of a computing device. In embodiments, the process may involve initially identifying whether there is at least one bit error in a received codeword. If there is at least one error, then a simplified single-bit error correction algorithm may be attempted. If the single-bit error correction algorithm fails, then a more comprehensive decoding and error correction algorithm such as the BM algorithm may be attempted.

Initially, a controller such as controller 110, and more specifically a decoder of the controller 110 such as decoder 114, may identify received codeword r and a parity-check matrix H at 200. The codeword r may be received as the result of reading data from an NVM 104. In general, any linear block code, for example a linear block code encoded according to one of the encoding schemes listed above, may be represented by its parity-check matrix H. In embodiments, the parity-check matrix H may be calculated by the controller 110 or the decoder 114 as described below. In other embodiments, the parity-check matrix H may be previously calculated and stored by the NVM 104, the controller 110, the decoder 114, or elsewhere in the computer system containing the storage drive 100. The rows of the parity-check matrix H may be the basis vectors of the dual space to the space of all valid codewords. Therefore, in embodiments, any valid codeword for the data may be orthogonal to each row of the H matrix. In some embodiments, H may be binary, that is containing only values of "1" and "0." In other embodiments, H may be non-binary, hereby referred to as H', and contain three or more different values. In these embodiments, it may be desirable to convert non-binary parity-check matrix H' into a binary parity-check matrix H, as explained more fully below in FIG. 4.

Next, the controller 110 may compute the syndrome H*r for the received codeword r and the parity-check matrix H at 205. In other words, the parity-check matrix H may be multiplied against the received codeword r. As noted above, a valid codeword r may be orthogonal to each row of the parity-check matrix H. Therefore, if the parity-check matrix H is multiplied against a valid, or error-free, codeword r, then the syndrome may be equal to 0 and the process may end at 230 because there are no errors to correct. However, if the parity-check matrix H is multiplied against a codeword r that contains an error, then the syndrome may be equal to a value other than 0, denoted as $h_i$, as will be explained in further detail.

If the syndrome $h_i$ is equal to a value other than 0, then single-bit error correction may be attempted at 215. The single-bit error correction will be explained in further detail below with regards to FIG. 3, but in general the single-bit error correction may involve comparison of the value $h_i$ with one or more columns in the parity-check matrix H. In embodiments, i may be the location of the single-bit error in the received codeword r, and so $h_i$ may be identical to a column of the parity-check matrix H. In other words, the location of the single-bit error in the codeword may be identified by determining the index of the column in H that matches the syndrome $h_i$.

If the column in H that matches $h_i$ is identified at 215, then the single-bit error may be corrected and the single-bit error correction may be determined a success at 220. The process may then end at 230. However, if the column in H that matches $h_i$ is not identified, then the controller may determine that the single-bit error correction is not a success at 220. Specifically, $h_i$ may not match a column in H because there are errors in multiple-bits of the codeword. Therefore, a multi-bit error correction algorithm such as a BM algorithm or some other algorithm may be performed to correct the errors in the codeword at 225, and the process may end at 230.

Figure 3:
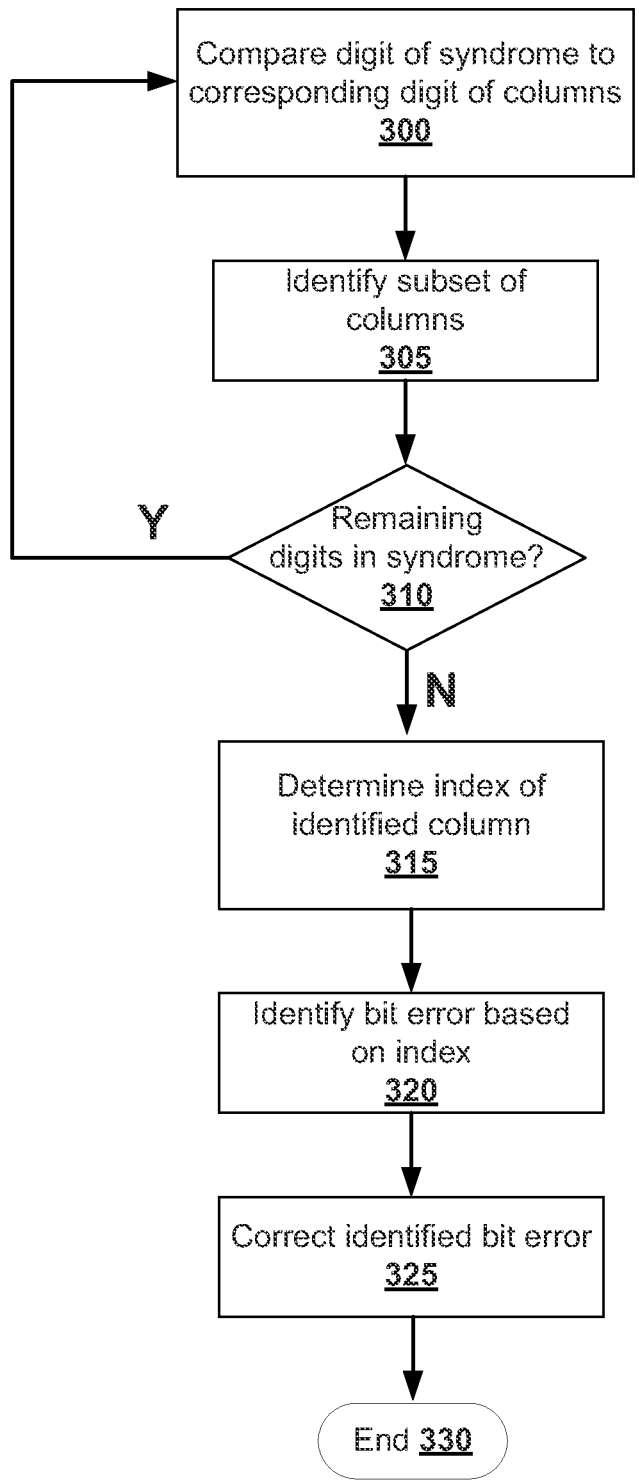
FIG. 3 illustrates an example process of correcting single-bit errors in a codeword, in accordance with various embodiments.

FIG. 3 illustrates an example of a single-bit error correction process, for example the single-bit error correction process above at 215. As discussed above, if the codeword contains a single-bit error, then the syndrome $h_i$ of the codeword may be non-zero and equal to a column in the parity-check matrix H. In some embodiments, the parity-check matrix if may be very large, and so comparison of the syndrome $h_i$ to each column in the parity-check matrix H may be infeasible or undesirable. Therefore, in one embodiment, the column in the parity-check matrix H that matches the syndrome $h_i$ may be determined by an algorithm such as a binary search tree algorithm.

In embodiments of the binary search tree algorithm, a first digit of the syndrome $h_i$ may be compared to a first digit of one or more of the columns in the parity-check matrix at 300. The first digit may be the most significant bit of the codeword, the least significant bit of the codeword, or some other digit of the codeword. A subset of columns of the parity-check matrix H where a first digit of the columns in the subset of columns matches a first digit of the syndrome $h_i$ may be identified at 305. For example, if a first digit of the syndrome $h_i$ is 1, then the subset of columns may only contain columns with a first digit of 1, and columns with a first digit of 0 are discarded from further analysis. If there are remaining digits in the syndrome $h_i$ at 310, then the process may be repeated for the next digit at 300. For example, the second digit of the syndrome $h_i$ may be compared to the second digit in the subset of columns at 305 to identify a further subset of columns. By performing the binary search tree algorithm described in processes 300, 305, and 310, the time and computing power used to identify the column in the parity-check matrix H that matches the syndrome $h_i$ may be significantly reduced.

If a column in the parity-check matrix H matches the syndrome $h_i$, then the column may be identified in process 305 upon comparison of a last digit of the syndrome $h_i$ with one or more columns of the parity-check matrix H. Therefore, there will be no remaining digits in the syndrome at 310 and the index of the identified column may be determined at 315. The index of the identified column may be considered to be the location of the identified column in the parity-check matrix H. If the syndrome $h_i$ does not match a column of the parity-check matrix H, then it may be determined at 220 that the single-bit error correction was not a success and the process may continue to multi-bit error correction at 225, as described above.

After the index of the identified column is determined at 315, the location of the bit error may be determined at 320. Specifically, the index of the column may be considered to be the i-th column of the parity-check matrix H, and so the location of the bit error may be the i-th digit in the received codeword r. Therefore, after the bit error in the received codeword r is identified, then the bit error may be corrected at 325. The correction may be relatively simple, for example swapping the bit in digit from a value of "1" to a value of "0", or vice versa, or the correction may be performed according to a more complicated algorithm.

Figure 4:
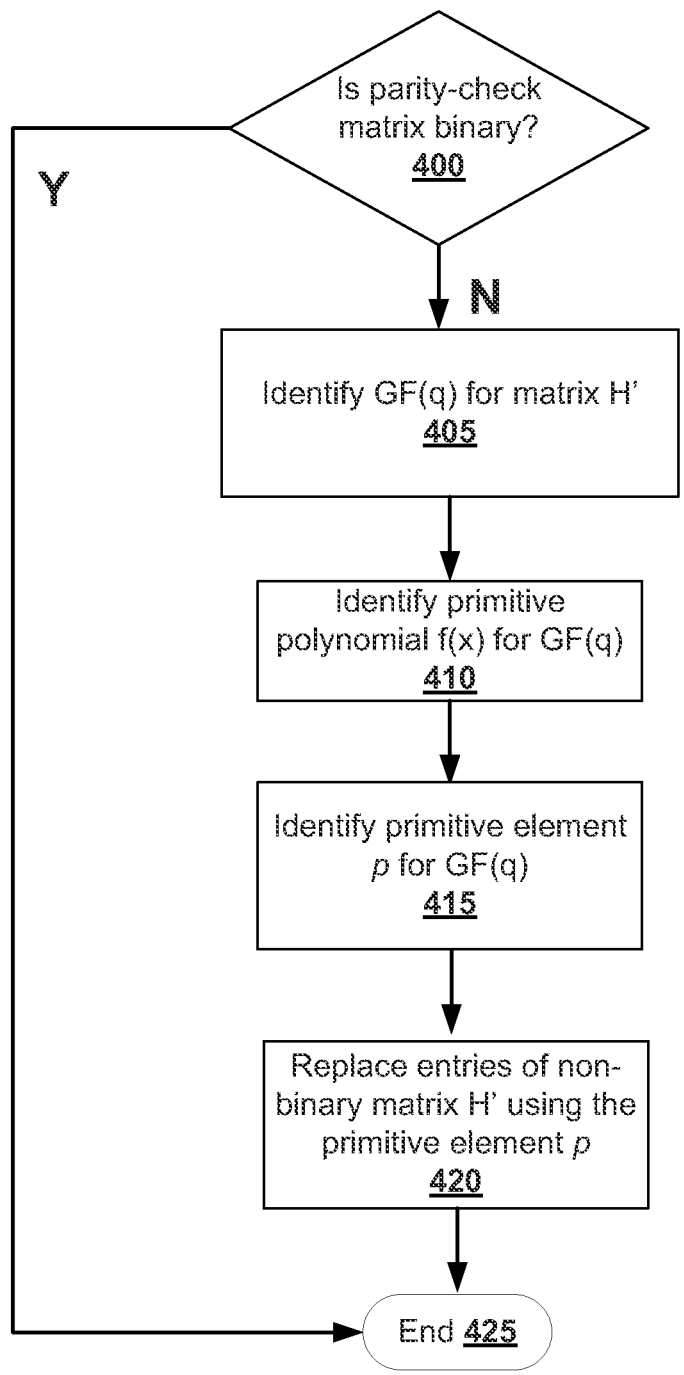
FIG. 4 illustrates an example process of identifying a binary parity-check matrix for a codeword, in accordance with various embodiments.

As noted above, in some embodiments the parity-check matrix H may not be binary, referred to herein as non-binary parity-check matrix H'. However, the process described in FIG. 2 may be less resource-intensive if the parity-check matrix is a binary parity-check matrix H. Therefore, in some embodiments, it may be desirable to convert a non-binary parity-check matrix H' into a binary parity-check matrix H. In general, this conversion may be accomplished by replacing each entry in the non-binary parity-check matrix H' by a corresponding binary entry, as described below. FIG. 4 describes an example process for converting a non-binary parity-check matrix IT into a binary parity-check matrix H. Initially, a controller such as controller 110 may identify whether the parity-check matrix is a binary parity-check matrix H or a non-binary parity-check matrix H' at 400. If the matrix is identified to be a binary parity-check matrix H, then the process of FIG. 4 may end at 425 and the process of FIG. 2 may continue as described above.

However, if the parity-check matrix is a non-binary parity-check matrix H', then the process may continue as shown in FIG. 4. In some instances, the non-binary parity-check matrix H' may have entries from a Galois field (GF) of GF(q) where $q=2^m$. A Galois field may be considered to be a field with a limited number of different values, in may be some integer. Therefore, GF(q) where m is equal to 1 may only have two possible values, for example [0, 1], and be considered binary. However, if in is equal to 2, then GF(q) may have four possible values, for example [0, 1, 2, 3], and be considered non-binary. In other embodiments, in may be equal to any positive integer.

Initially, q is identified for a given non-binary parity-check matrix H' by a controller such as controller 110 at 400. For this example, assume that the non-binary parity-check matrix $$H' = \begin{bmatrix} 0 & 1 \\ 2 & 3 \end{bmatrix}.$$

Because the non-binary parity-check matrix H' contains four distinct values, it may be determined that q=4 and therefore m=2. Throughout the remainder of the example used herein, assume that m is equal to 2 and GF(q) contains the values [0, 1, 2, 3]. However, these values are intended only as an example, and different values of H', q, and m, as well as the corresponding matrices, polynomials and elements that follow, may be different in different embodiments. Although the values listed above are one example of possible values, the process may be performed for other values of m, and in other embodiments the Galois field for a given integer in such as 2 may contain different values.

Based on GF(q), the controller may then identify the primitive polynomial f(x) for GF(q) at 405. In embodiments, a primitive polynomial may be considered to be a polynomial that is able to generate all elements of a given extension field from a base field. In the embodiment where m=2, GF(q) may be equal to $GF(2^2)$ and therefore the primitive polynomial f(x) may be $f(x)=x^2+x+1$.

After identifying the primitive polynomial f(x) for GF(q), the primitive element matrix p may be identified. In general, for any primitive polynomial $f(x)=x^m+\ldots+a_2x^2+a_1x^1+a_0$, the primitive element matrix p may include m×m in entries and may be defined as:

$$p = \begin{bmatrix} 0 & 1 & \ldots & 0 & 0 \\ 0 & 0 & \ldots & 0 & 0 \\ \vdots & \vdots & \ddots & \vdots & \vdots \\ 0 & 0 & \ldots & 0 & 1 \\ a_0 & a_1 & \ldots & a_{m-2} & a_{m-1} \end{bmatrix}$$

If m is equal to 2, and the primitive polynomial $f(x)=x^2+x+1$ as discussed above, then the primitive m×m element matrix p for m=2 may be defined using the above generalized equation for p as $$p = \begin{bmatrix} 0 & 1 \\ 1 & 1 \end{bmatrix}.$$

After the primitive element matrix p is identified at 410, then any element of GF(q) may be expressible as a power of p. For example, GF(q) may be generalized as $GF(q)=[0, 1, p, p^2, \ldots p^{q-2}]$. In this embodiment, the value of "0" may be the m×m matrix where all entries have the value "0." Similarly, the value of "1" may be the m×m identity matrix. Therefore, each element in the non-binary parity-check matrix H' may be replaced using an m×m matrix such as the m×m "0" matrix, the m×m identity matrix, the m×m primitive element matrix p, or powers of the m×m primitive element matrix p, at 415.

In this specific example, if GF(q)=[0, 1, 2, 3], then the element of GF(q) may be converted into a binary format such that $GF(q)=[0, 1, p, p^2]$. As noted, each entry in GF(q) may be converted to an m×m binary matrix. Therefore, the entry "0" may be the 2×2 matrix $$\begin{bmatrix} 0 & 0 \\ 0 & 0 \end{bmatrix}.$$

The entry "1" may be the 2×2 identity matrix, $$\begin{bmatrix} 1 & 0 \\ 0 & 1 \end{bmatrix}.$$

The entry "p" may be the 2×2 matrix $$\begin{bmatrix} 0 & 1 \\ 1 & 1 \end{bmatrix}.$$

The entry "$p^2$" may be p×p, or the 2×2 matrix $$\begin{bmatrix} 1 & 1 \\ 1 & 0 \end{bmatrix}.$$

In embodiments, the calculation of a power of the primitive element matrix p, may be calculated modulo 2. Therefore, any even value may be reset to a value of "0," while any odd value may be reset to a value of "1." In some embodiments, the modulo 2 operation may be performed at the end of the calculation such that $p^3=(p\times p\times p)$ modulo 2. In other embodiments, the modulo 2 operation may be performed incrementally such that $p^3=([(p\times p)\text{ modulo }2]\times p)$ modulo 2. In other embodiments, the modulo operation may be performed at other points of the process.

In the example of m=2 where the non-binary parity-check matrix $$H' = \begin{bmatrix} 0 & 1 \\ 2 & 3 \end{bmatrix},$$

the entries of the matrix may therefore be replaced by the replacement entries described above to construct the binary parity-check matrix H as:

$$H = \begin{bmatrix} 0 & 1 \\ p & p^2 \end{bmatrix} = \begin{bmatrix} 0 & 0 & 1 & 0 \\ 0 & 0 & 0 & 1 \\ 0 & 1 & 1 & 1 \\ 1 & 1 & 1 & 0 \end{bmatrix}$$

Therefore, by replacing every element of GF(q) with the appropriate power of the primitive element matrix p, it may be possible to convert a non-binary parity-check matrix H' into a binary parity-check matrix H. The received binary codeword r may then be multiplied with the binary parity-check matrix H at 205 as described above with respect to FIG. 2.

Figure 5:
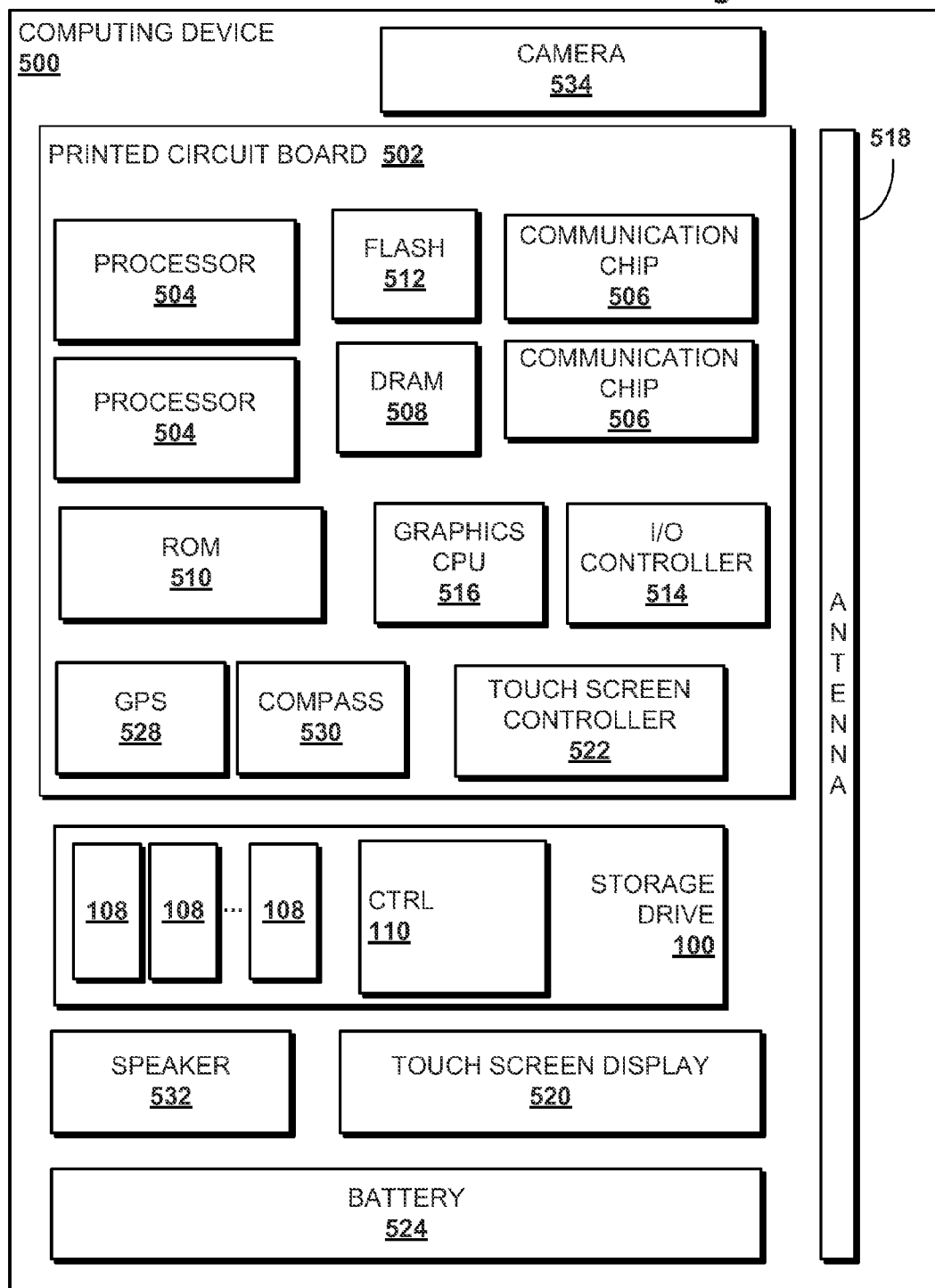
FIG. 5 illustrates an example system configured to perform the methods described herein, in accordance with various embodiments.

FIG. 5 illustrates an example computing device 500 in which systems such as storage device 100 may be incorporated, in accordance with various embodiments. Computing device 500 may include a number of components, one or more processor(s) 504 and at least one communication chip 506. In various embodiments, the one or more processor(s) 504 each may include one or more processor cores. In various embodiments, the at least one communication chip 506 may be physically and electrically coupled to the one or more processor(s) 504. In further implementations, the communication chip 506 may be part of the one or more processor(s) 504. In various embodiments, computing device 500 may include PCB 502. For these embodiments, the one or more processor(s) 504 and communication chip 506 may be disposed thereon. In alternate embodiments, the various components may be coupled without the employment of PCB 502.

Depending on its applications, computing device 500 may include other components that may or may not be physically and electrically coupled to the PCB 502. These other components include, but are not limited to, volatile memory (e.g., DRAM 508), non-volatile memory such as read only memory 510 (ROM) and storage device 100 (which may include die 108 and controller 110 as described earlier), an I/O controller 514, a digital signal processor (not shown), a crypto processor (not shown), a graphics processor 516, one or more antenna 518, a display (not shown), a touch screen display 520, a touch screen controller 522, a battery 524, an audio codec (not shown), a video codec (not shown), a global positioning system (GPS) device 528, a compass 530, an accelerometer (not shown), a gyroscope (not shown), speaker 532, a camera 534, and a mass storage device (such as hard disk drive, a solid state drive, compact disk (CD), digital versatile disk (DVD)) (not shown), and so forth. In various embodiments, the processor 504, storage drive 100, and/or controller 110 may be integrated on the same die with other components to form an SoC.

In various embodiments, rather than or in addition to storage device 100, computing device 500 may include resident non-volatile memory, e.g., flash memory 512. In some embodiments, the one or more processor(s) 504 and/or flash 512 may include associated firmware (not shown) storing programming instructions configured to enable computing device 500, in response to execution of the programming instructions by one or more processor(s) 504 to practice all or selected aspects of the blocks described above with respect to FIG. 3, 4, or 5. In various embodiments, these aspects may additionally or alternatively be implemented using hardware separate from the one or more processor(s) 504 or flash memory 512.

The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as WiFi and Bluetooth and a second communication chip 506 may be dedicated to longer range wireless communications such as UPS, EDGE, GPRS, CDMA, WiMAX, LTE, Ev-DO, and others.

In various implementations, the computing device 500 may be a laptop, a netbook, a notebook, an ultrabook, a smartphone, a computing tablet, a personal digital assistant (PDA), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 500 may be any other electronic device that processes data.

An embodiment may include an apparatus to identify a bit error. The apparatus may include a memory to store a codeword of an encoded data, and a controller coupled with the memory. The controller may be configured to multiply a multi-column parity-check matrix and the codeword of the encoded data read from the memory to produce a syndrome of the encoded data, and identify a bit error in the codeword of the encoded data based at least in part on a comparison of the syndrome to one or more columns of the parity-check matrix. In embodiments, the controller may be further configured to identify a location of the bit error based at least in part on the comparison. In embodiments, the comparison may comprise a binary tree comparison. In embodiments, the parity-check matrix may be a binary matrix. In embodiments, the parity-check matrix may include one or more elements based at least in part on a primitive polynomial of the codeword. In embodiments, an element in the one or more elements may include an m×m matrix wherein in is an integer based at least in part on a number of possible values in the codeword. In embodiments, the codeword may be a Bose-Ray-Chaudhuri (BCH) codeword or a Reed-Solomon (RS) codeword. In embodiments, the apparatus may be a computing device, further including a number of processor cores coupled with the controller. The apparatus may also have a solid state drive coupled with the controller, the solid state drive including the memory, and a battery coupled with the controller. In embodiments, the apparatus may be a personal digital assistant (PDA), a smartphone, a computing tablet, an e-reader, an ultrabook, a laptop computer, a desktop computer, a server, a set-top box, or a game console.

In embodiments, one or more computer readable media may include instructions to identify a bit error, the instructions configured to cause an apparatus, in response to execution of the instructions by the apparatus, to receive a codeword of an encoded data, multiply a multi-column parity-check matrix and the codeword to identify a syndrome of the encoded data; and identify a bit error in the codeword based at least in part on a comparison of the syndrome to one or more columns of the parity-check matrix. In embodiments, the instructions may further cause the apparatus to identify a location of the bit error in the codeword based at least in part on the comparison. In embodiments, the comparison may be a binary tree comparison. In embodiments, the parity-check matrix may include one or more elements based at least in part on a primitive polynomial of the codeword.

In embodiments, a method of identifying a bit error may include reading, by a controller, a codeword of an encoded data stored in a non-volatile memory, multiplying, by the controller, a multi-column parity-check matrix and the codeword to identify a syndrome of the encoded data, and identifying, by the controller, the bit error based at least in part on matching the syndrome to one or more columns in the plurality of columns of the parity-check matrix. In embodiments, the method may further include identifying, by the controller, a location of the bit error based at least in part on a location of the column in the plurality of columns matching the syndrome. In embodiments, the parity check-matrix may be a binary matrix. In embodiments, the matching may be performed according to a binary tree format. In embodiments, the parity-check matrix may include one or more elements based at least in part on a primitive polynomial of the codeword. In embodiments, an element in the one or more elements may include an m×m matrix wherein in is an integer based at least in part on a number of possible values in the codeword. In embodiments, the codeword may be a Bose-Ray-Chaudhuri (BCH) codeword or a Reed-Solomon (RS) codeword.

In embodiments, a device to identify a bit error may include means to read a codeword of an encoded data stored in a non-volatile memory, means to multiply a multi-column parity-check matrix and the codeword to identify a syndrome of the encoded data, and means to identify the bit error based at least in part on matching the syndrome to one or more columns the plurality of columns of the parity-check matrix. In embodiments, the device may further include means to identify a location of the bit error based at least in part on a location of the column in the plurality of columns matching the syndrome. In embodiments, the parity-check matrix may be a binary matrix. In embodiments, the matching may be performed according to a binary tree format. In embodiments, the parity-check matrix may include one or more elements based at least in part on a primitive polynomial of the codeword. In embodiments, an element in the one or more elements may include an m×m matrix wherein m is an integer based at least in part on a number of possible values in the codeword. In embodiments, the codeword may be a Bose-Ray-Chaudhuri (BCH) codeword or a Reed-Solomon (RS) codeword.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. An apparatus comprising:
a memory to store a codeword of an encoded data; and
a controller coupled with the memory to:
compute a syndrome of the encoded data when reading the encoded data from the memory;
determine whether the encoded data contains at least one bit of error based at least in part on the syndrome;
first attempt to correct the at least one bit of error with a single-bit correction process; and
second attempt to correct the at least one bit of error with a multi-bit correction process if the first attempt fails to correct the entire at least one bit of error due to the encoded data having multi-bit errors;
wherein compute a syndrome includes multiply a multi-column parity-check matrix and the codeword of the encoded data read from the memory to produce the syndrome of the encoded data;
wherein determine includes determine whether the syndrome is non-zero; and
wherein the first attempt includes identify a single bit error in the codeword of the encoded data based at least in part on a comparison of the non-zero syndrome to one or more columns of the parity-check matrix.

2. The apparatus of claim 1, wherein the controller is to further identify a location of the bit error based at least in part on the comparison.

3. The apparatus of claim 1, wherein the comparison comprises a binary tree comparison.

4. The apparatus of claim 1, wherein the parity-check matrix is a binary matrix.

5. The apparatus of claim 1, wherein the parity-check matrix comprises one or more elements based at least in part on a primitive polynomial of the codeword.

6. The apparatus of claim 5, wherein an element in the one or more elements comprise an m×m matrix wherein m is an integer based at least in part on a number of possible values in the codeword.

7. The apparatus of claim 1, wherein the codeword is a Bose-Ray-Chaudhuri (BCH) codeword or a Reed-Solomon (RS) codeword.

8. The apparatus of claim 1, wherein the apparatus is a computing device further comprising
a number of processor cores coupled with the controller;
a solid state drive coupled with the controller, the solid state drive comprising the memory; and
a battery coupled with the controller.

9. The apparatus of claim 8, wherein the apparatus is a personal digital assistant (PDA), a smartphone, a computing tablet, an e-reader, an ultrabook, a laptop computer, a desktop computer, a server, a set-top box, or a game console.

10. One or more non-transitory computer readable media comprising instructions to cause an apparatus, in response to execution of the instructions by the apparatus, to:
receive a codeword of an encoded data;
compute a syndrome of the encoded data using the codeword;
determine whether the encoded data contains at least one bit of error based at least in part on the syndrome;
first attempt to correct the at least one bit of error with a single-bit correction process; and
second attempt to correct the at least one bit of error with a multi-bit correction process if the first attempt fails to correct the entire at least one bit of error due to the encoded data having multi-bit errors;
wherein compute a syndrome includes multiply a multi-column parity-check matrix and the codeword to identify the syndrome of the encoded data;
wherein determine includes determine whether the syndrome is non-zero; and
wherein first attempt includes identify a single bit error in the codeword based at least in part on a comparison of the non-zero syndrome to one or more columns of the parity-check matrix.

11. The one or more computer readable media of claim 10, wherein the instructions are to further e-cause the apparatus, in response to execution of the instructions by the apparatus, to identify a location of the bit error in the codeword based at least in part on the comparison.

12. The one or more computer readable media of claim 10, wherein the comparison comprises a binary tree comparison.

13. The one or more computer readable media of claim 10, wherein the parity-check matrix comprises one or more elements based at least in part on a primitive polynomial of the codeword.

* * * * *